United States Patent
Van De Ven et al.

(10) Patent No.: US 7,978,307 B2
(45) Date of Patent: Jul. 12, 2011

(54) GAS BEARING, AND LITHOGRAPHIC APPARATUS PROVIDED WITH SUCH A BEARING

(75) Inventors: Bastiaan Lambertus Wilhelmus Marinus Van De Ven, Rosmalen (NL); Johannes Adrianus Antonius Theodorus Dams, Veldhoven (NL); Jacob Willem Vink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1088 days.

(21) Appl. No.: 11/417,222

(22) Filed: May 4, 2006

(65) Prior Publication Data
US 2007/0258069 A1   Nov. 8, 2007

(51) Int. Cl.
*F16C 17/00*   (2006.01)
*F16C 32/06*   (2006.01)
*G03B 27/32*   (2006.01)
*G03B 27/42*   (2006.01)
*G03B 27/58*   (2006.01)
*G03B 27/62*   (2006.01)
*H02K 41/02*   (2006.01)

(52) U.S. Cl. .......... 355/72; 310/12.31; 355/53; 355/75; 355/77; 384/8; 384/12

(58) Field of Classification Search .......... 355/53, 355/72–73, 75–76, 55, 77; 384/7–9, 12, 384/53, 72, 75, 91, 100, 108, 114, 118, 124, 384/446, 912; 310/12.31, 90.5
See application file for complete search history.

(56) References Cited

U.S. PATENT DOCUMENTS

| | | | | |
|---|---|---|---|---|
| 3,885,504 A | * | 5/1975 | Baermann | 104/283 |
| 5,098,203 A | * | 3/1992 | Henderson | 384/12 |
| 5,821,981 A | * | 10/1998 | Menard et al. | 347/260 |
| 6,304,320 B1 | * | 10/2001 | Tanaka et al. | 355/73 |
| 6,320,649 B1 | * | 11/2001 | Miyajima et al. | 355/72 |
| 7,088,429 B2 | | 8/2006 | Ohishi | |
| 7,385,679 B2 | * | 6/2008 | Dams | 355/75 |
| 2004/0174080 A1 | * | 9/2004 | Beyer et al. | 310/90.5 |
| 2005/0084187 A1 | * | 4/2005 | Kimura | 384/12 |

FOREIGN PATENT DOCUMENTS

| | | |
|---|---|---|
| JP | 8-177856 A | 7/1996 |
| JP | 10-199803 A | 7/1998 |
| JP | 2002-333018 A | 11/2002 |
| JP | 2005-033214 A | 2/2005 |
| JP | 2005-116627 A | 4/2005 |
| JP | 2007-219310 A | 8/2007 |

OTHER PUBLICATIONS

Notice of Reasons for Rejection mailed Apr. 21, 2010 for Japanese Patent Application No. 2007-113701, 5 pgs.

* cited by examiner

*Primary Examiner* — Hung Henry Nguyen
*Assistant Examiner* — Colin Kreutzer
(74) *Attorney, Agent, or Firm* — Sterne, Kessler, Goldstein & Fox P.L.L.C.

(57) ABSTRACT

A gas bearing has a first bearing part defining a first bearing surface and a second bearing part defining a second bearing surface. Between the first bearing surface and the second bearing surface there is a gap. A gas supply device supplies a gas to the gap. The first bearing part is at least partly ferromagnetic, and the second bearing part has at least one permanent magnet interacting with the first bearing part for pretensioning the gas bearing. The gas bearing may be part of a lithographic apparatus.

14 Claims, 4 Drawing Sheets

GAS BEARING, AND LITHOGRAPHIC APPARATUS PROVIDED WITH SUCH A BEARING

BACKGROUND

1. Field of the Invention

The present invention relates to a gas bearing, and to a lithographic apparatus provided with such a bearing.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus contains a large number of moving parts, where a relatively large mass is moved at high speed and at a high accuracy to a specific position, possibly with a predetermined setpoint profile of the movement. The moving part is to be moved relative to a frame part, which frame part may be movable in turn relative to another frame part. As an example, reference is made to a substrate stage having a substrate support which carries a substrate. The dimensions of a substrate may be considerable, and hence the dimensions and weight of the substrate support are considerable.

In order to ensure a smooth movement of the moving part with a required change in position over time, and with a required accuracy, the moving part is supported by gas bearings relative its associated frame part. A gas bearing includes two surfaces which are highly complementary to each other. The surfaces usually are flat and straight, but they may also be curved, or e.g. V-shaped when viewed in cross-section. Between the surfaces, a gas film is maintained allowing a virtually frictionless movement of the moving part relative to the associated frame part.

In the prior art, a gas bearing assembly composed of one or more gas bearing parts connected to each other and to a magnet plate to be movable relative to a ferromagnetic frame part has been used. The magnet plate includes permanent magnets, drawing the gas bearing parts towards the frame part. Thus, a pre-tensioned or pre-loaded gas bearing is obtained. However, the surface area on the frame part needed for such a gas bearing assembly is relatively large, since it includes the combined surface area of the gas bearing parts and the magnet plate. A further drawback is the stiffness needed for the gas bearing assembly, resulting in a relatively bulky structure, adding mass to the moving part.

SUMMARY

It is desirable to provide a pre-tensioned or pre-loaded gas bearing of small dimensions.

According to an embodiment of the present invention, there is provided a gas bearing, including: a first bearing part defining a first bearing surface; a second bearing part defining a second bearing surface; a gap between the first bearing surface and the second bearing surface; and a gas supply device to supply a gas to the gap, wherein the first bearing part includes a ferromagnetic material, and the second bearing part includes at least one permanent magnet interacting with the ferromagnetic material of the first bearing part.

According to another embodiment of the present invention, there is provided a lithographic apparatus arranged to transfer a pattern from a patterning device onto a substrate, the apparatus having at least one gas bearing, the gas bearing including: a first bearing part defining a first bearing surface; a second bearing part defining a second bearing surface; a gap between the first bearing surface and the second bearing surface; and a gas supply device to supply a gas to the gap, wherein the first bearing part includes a ferromagnetic material, and the second bearing part includes at least one permanent magnet interacting with the ferromagnetic material of the first bearing part.

According to another embodiment of the present invention, there is provided a lithographic apparatus including: an illumination system configured to condition a radiation beam; a patterning support constructed to support a patterning device, the patterning device being capable of imparting the radiation beam with a pattern in its cross-section to form a patterned radiation beam; a substrate support constructed to support a substrate; and a projection system configured to project the patterned radiation beam onto a target portion of the substrate, wherein at least one of the patterning support and the substrate support includes a gas bearing, the gas bearing including: a first bearing part defining a first bearing surface; a second bearing part defining a second bearing surface; a gap between the first bearing surface and the second bearing surface; and a gas supply device to supply a gas to the gap, wherein the first bearing part includes a ferromagnetic material, and the second bearing part includes at least one permanent magnet interacting with the ferromagnetic material of the first bearing part.

In an embodiment of the invention, there is provided a gas bearing including a first bearing part defining a first bearing surface, the first bearing part including a ferromagnetic material, a second bearing part defining a second bearing surface, the second bearing part including a frame that is adapted to receive at least one permanent magnet; and a gas supply device configured to supply gas to a gap that extends between the first bearing surface and the second bearing surface, wherein the at least one permanent magnet of the second bearing part interacts with the ferromagnetic material of the first bearing part through a portion of the frame to reduce the gap.

In another embodiment of the invention, there is provided a method of moving a first part relative to a second part, the first part defining a first bearing surface and including a ferromagnetic material, and the second bearing part including a frame that is adapted to receive at least one permanent magnet, the method including providing a flow of gas in a gap between the first bearing surface and the second bearing surface; and creating a magnetic interaction between the at least one permanent magnet of the first bearing part and the ferromagnetic material of the second bearing part through a portion of the frame so as to reduce the gap.

In an embodiment, there is provided a gas bearing, including a first bearing part defining a first bearing surface, the first bearing part including a ferromagnetic material; a second bearing part defining a second bearing surface, the second bearing part including a frame that is adapted to receive at least one permanent magnet; and a gas supply device configured to supply gas to a gap that extends between the first bearing surface and the second bearing surface, wherein the at least one permanent magnet of the second bearing part interacts with the ferromagnetic material of the first bearing part through a portion of the frame to reduce said gap.

In another embodiment, there is provided a method of moving a first part relative to a second part, the first part defining a first bearing surface and including a ferromagnetic material, and the second part defining a second bearing surface and including a frame that is adapted to receive at least one permanent magnet, the method including supplying gas between the first bearing surface and the second bearing surface so as to create a gap between the first bearing surface and the second bearing surface; and creating a magnetic interaction between the at least one permanent magnet of the first part and the ferromagnetic material of the second part through a portion of the frame so as to reduce the gap.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
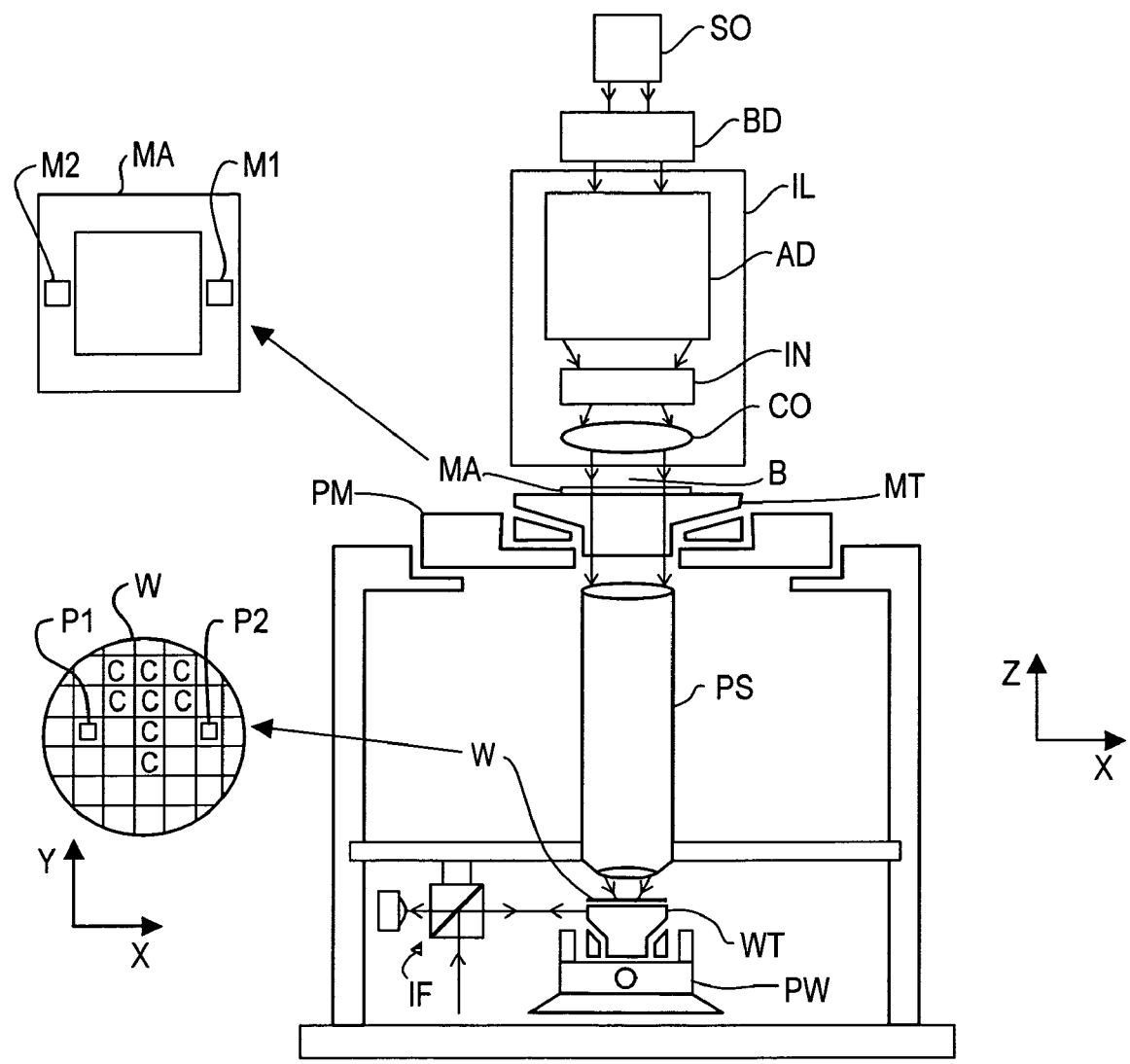
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The first positioning device PM and the second positioning device PW may include one or more gas bearings according to an embodiment of the invention, as described below in detail with reference to, for example, to FIGS. 2, 3 and/or 4. Also other moving components of the lithographic apparatus or other similar apparatus may include one or more gas bearings according to an embodiment the invention.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate.

An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
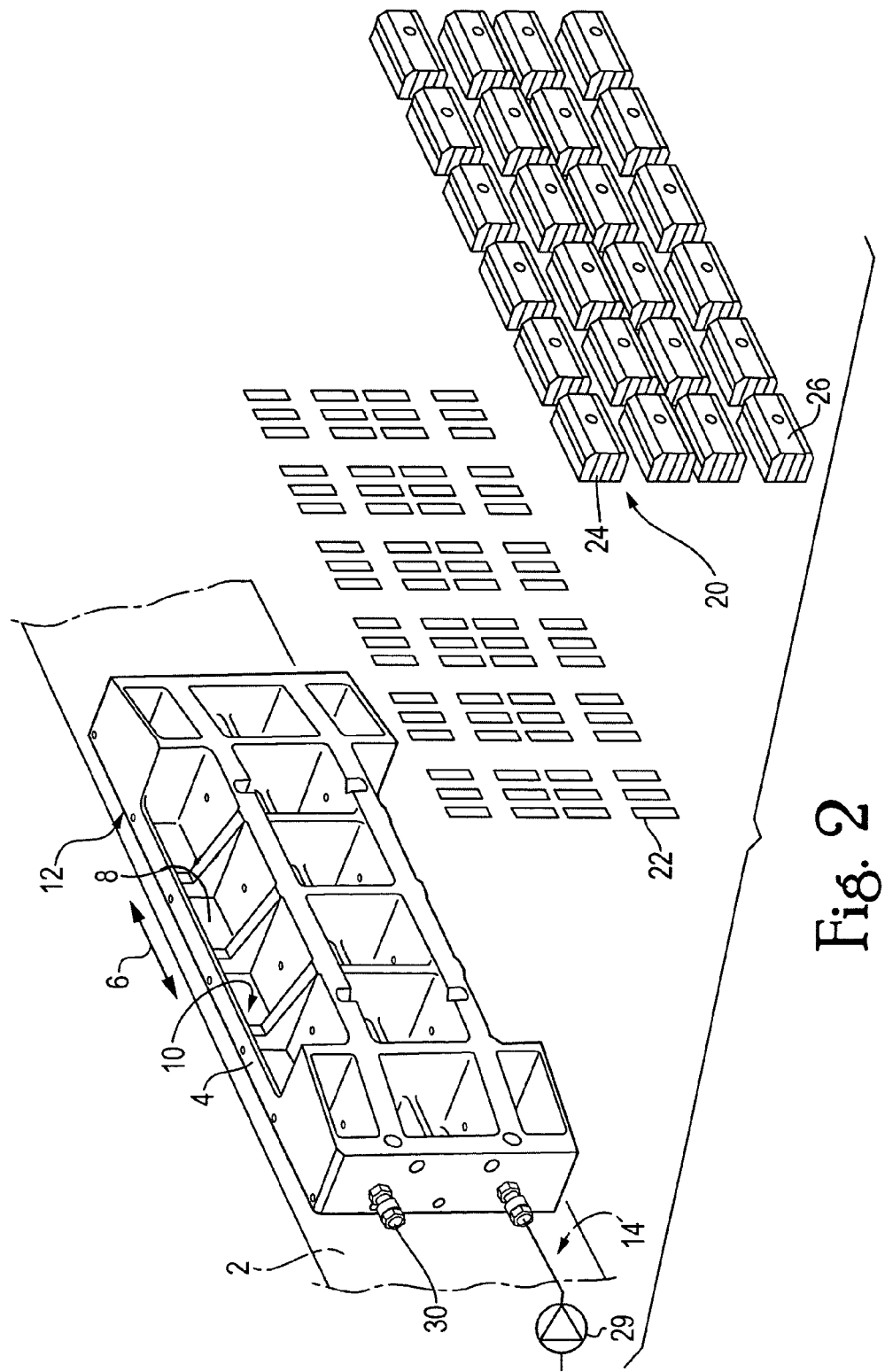
FIG. 2 depicts an exploded, perspective view of a bearing according to an embodiment of the invention.
Figure 3:
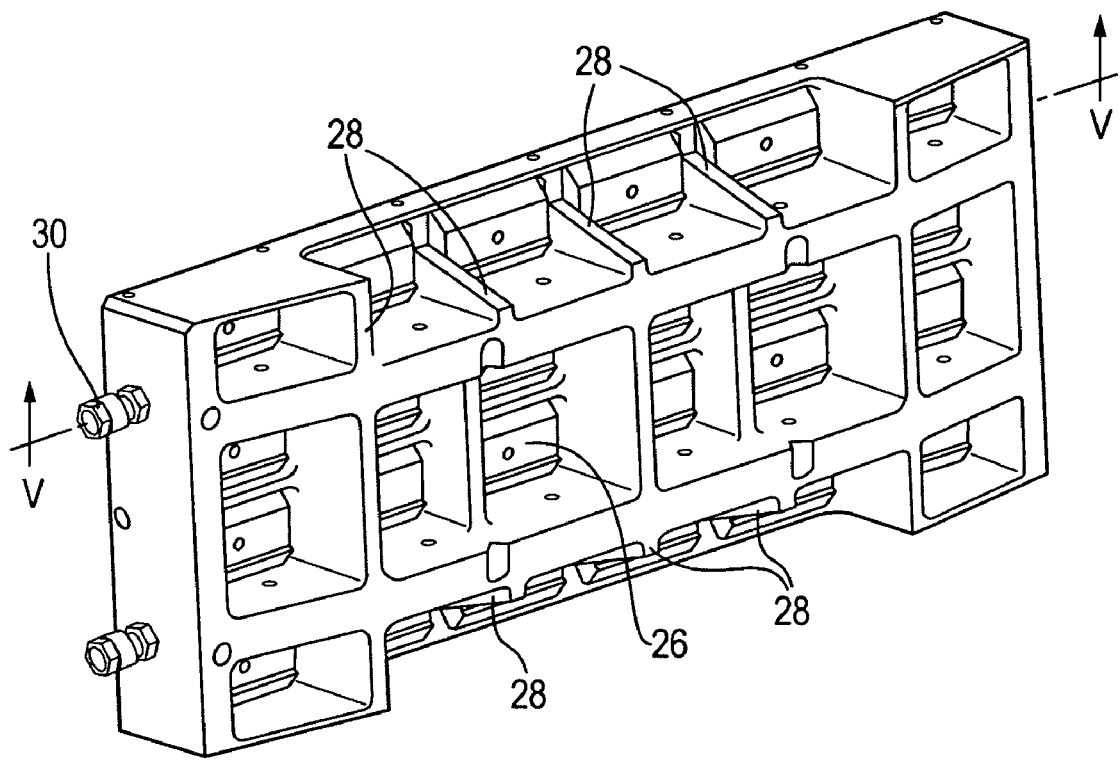
FIG. 3 depicts, in a perspective view, a part of the bearing of FIG. 2 in assembled form.

FIG. 2 shows a gas bearing according to an embodiment of the present invention, including a schematically indicated first bearing part 2, and a second bearing part 4 depicted in more detail. The first bearing part 2 and the second bearing part 4 are movable relative to each other in any of the directions indicated by the double arrow 6, and in other directions if the bearing construction so provides, such as at an angle to the arrow 6, or in a rotational sense. When considered relative to a specific frame of reference, the first bearing part 2 may be stationary while the second bearing part 4 is movable relative to the first bearing part 2. However, when a different frame of reference is considered, the second bearing 4 part may be stationary while the first bearing part 2 is movable relative to the second bearing part 4. Moreover, when a still different frame of reference is considered, both the first bearing part 2 and the second bearing part 4 may be movable relative to the latter frame of reference.

The first bearing part 2 includes a ferromagnetic material, i.e. is at least partially made from a ferromagnetic material. By way of example, the ferromagnetic material may have been applied as a layer on the first bearing part 2, or may have been fixed (i.e. glued, welded, screwed and the like) as a strip or plate on the first bearing part 2, in particular at the side of the first bearing part 2 facing the second bearing part 4. The first bearing part 2 may also be made entirely from a ferromagnetic material.

As shown in FIGS. 2, 3, 4 and 5, the second bearing part 4 includes a bottom wall 8 having a first side 10 facing away from the first bearing part 2, and a second side 12 facing the first bearing part 2. A side 14 of the first bearing part 2 facing the second bearing part 4 forms a first bearing surface, while the second side 12 of the bottom wall 8 forms a second bearing surface of the gas bearing.

Figure 4:
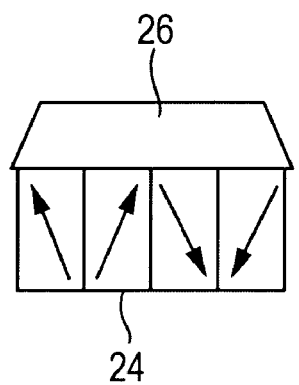
FIG. 4 schematically depicts, in a side view, an assembly of sub-magnets in accordance with an embodiment of the invention.
Figure 5:
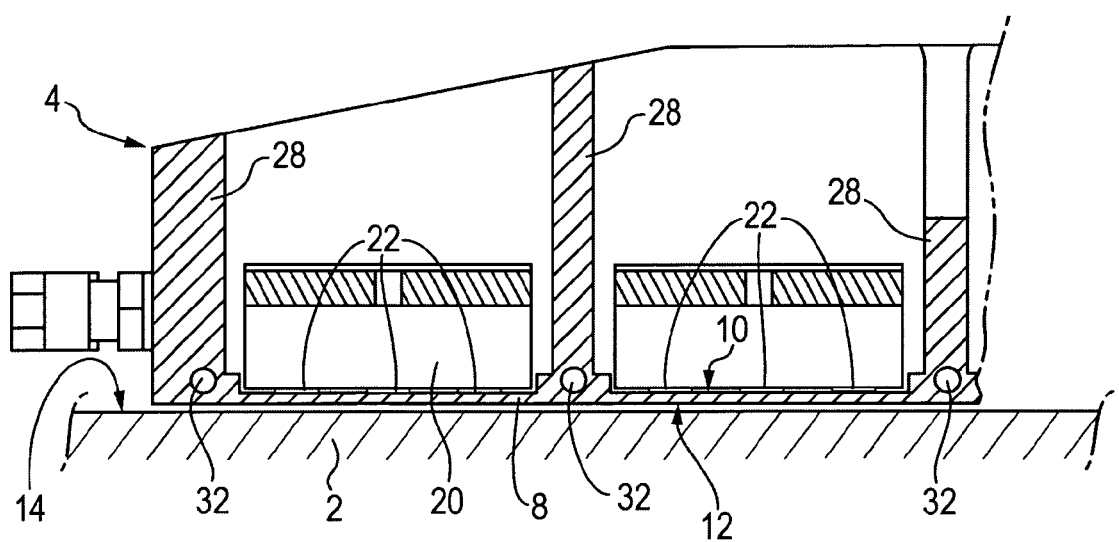
FIG. 5 depicts a cross-section of the assembled bearing of FIG. 3 along a line V-V in accordance with an embodiment of the invention.

The second bearing part 4 is provided with a plurality of permanent magnets 20 which are each fixed to the bottom wall 8 through a plurality of bonding areas 22. In FIGS. 2 and 4, as an example, three rectangular bonding areas are shown. However, also one, two, or more than three bonding areas, having possibly different shapes, may be used. The bonding area 22 may include a glue layer.

A permanent magnet 20 may include a plurality of sub-magnets 24, as shown in FIG. 2. FIG. 2 shows an embodiment having four sub-magnets 24 which have alternating directions of magnetization, or magnetic polarization, which may be directed essentially at right angles (i.e. substantially perpendicular) to the sides 10, 12 of the bottom wall 8 of the second bearing part 4, or the plane of the side 14 of the first bearing part 2. Alternatively, as shown by solid arrows in FIG. 4, the direction of magnetization of the sub-magnets 24 may be inclined to the sides 10, 12 of the bottom wall 8 of the second bearing part 4, or the plane of the side 14 of the first bearing part 2, thus having a non-zero component in a direction substantially parallel to the first or second bearing surface, and having a non-zero component in a direction substantially at right angles (i.e. substantially perpendicular) to the first or second bearing surface. At a side of the permanent magnet 20 facing away from the first side 10 of the bottom wall 8, the permanent magnet 20 is provided with a yoke part 26 made at least partially from a ferromagnetic material.

The permanent magnets 20 interact with the first bearing part 2 through magnetic attraction, thus exerting a force acting to reduce a gap between the first bearing surface and the second bearing surface.

The bonding areas 22 may compensate for any irregularities in the surface of the permanent magnet 20 (or, the combined surfaces of the sub-magnets 24) and the first side 10 of the bottom wall 8 facing each other. In this way, any temperature effects due to differences in coefficients of expansion of the bottom wall 8 and the permanent magnet 20 may be decreased. Further, by using a plurality of bonding areas 22 per permanent magnet 20, any forces exerted by the permanent magnet 20 interacting with the first bearing part 2 are spread evenly over the surface of the bottom wall 8.

The second bearing part 4 includes ribs 28 of different configurations and partly intersecting each other, supporting the bottom wall 8.

A gas is supplied to the gap between the first bearing surface and the second bearing surface from a gas supply device 29 (known per se, and shown only schematically) through a gas input 30 and ducts 32 in the ribs 28 leading to the second bearing surface, i.e. the second side 12 of the bottom wall 8 of the second bearing part 4. Instead or additionally, gas may also be supplied to the gap between the first bearing surface and the second bearing surface through ducts provided in the first bearing part 2 (details not shown in the Figures).

Integration of the permanent magnets 20 in the gas bearing including the first bearing part 2 and the second bearing part 4 provides a pre-tensioned gas bearing with a low surface area and relatively low mass.

The gas bearing includes two surfaces that are highly complementary to each other. Although the surfaces usually are flat and straight as illustrated in the embodiment above, they may also be curved, or e.g. V-shaped when viewed in cross-section.

The gas bearing may be used in a lithographic apparatus as described above with reference to FIG. 1, or any other type of lithographic apparatus. The gas bearing also finds an application in other types of apparatus using a gas bearing.

In the gas bearing according to an embodiment of the invention, any suitable gas, such as air or nitrogen gas, but not limited thereto, may be used.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language).

The descriptions above are intended to be illustrative, not limiting. Thus, it will be apparent to one skilled in the art that modifications may be made to the invention as described without departing from the scope and spirit of the claims set out below.

What is claimed is:
1. A gas bearing, comprising:
a first bearing part defining a first bearing surface;

a second bearing part defining a second bearing surface, the first and second bearing parts being arranged so as to define a gap between the first bearing surface and the second bearing surface; and a gas supply device configured to supply a gas to the gap, wherein the first bearing part comprises a ferromagnetic material, and the second bearing part comprises a permanent magnet configured to interact with the ferromagnetic material of the first bearing part, the second bearing surface being between the permanent magnet and the first bearing surface, wherein a portion of the permanent magnet is exposed to an atmosphere adjacent to the second bearing part.

2. The gas bearing of claim 1, wherein the gas supply device comprises a plurality of gas ducts in the second bearing part, the gas ducts opening out at the second bearing surface.

3. The gas bearing of claim 1, wherein the second bearing part comprises a bottom wall having a first side supporting the permanent magnet, and a second side forming the second bearing surface.

4. The gas bearing of claim 3, wherein the second bearing part comprises a plurality of ribs extending from the first side of the bottom wall adjacent to the permanent magnet.

5. The gas bearing of claim 1, wherein the permanent magnet comprises a plurality of sub-magnets having alternating directions of magnetization substantially perpendicular to the second bearing surface.

6. The gas bearing of claim 1, wherein the permanent magnet comprises a plurality of sub-magnets having directions of magnetization having a non-zero component in a direction substantially parallel to the second bearing surface, and having a non-zero component in a direction substantially perpendicular to the second bearing surface.

7. The gas bearing of claim 1, wherein the permanent magnet is provided with a yoke part made from a ferromagnetic material, the yoke part being situated at a side of the permanent magnet facing away from the second bearing surface.

8. The gas bearing of claim 1, wherein the second bearing part comprises an array of spaced permanent magnets.

9. The gas bearing of claim 3, wherein the permanent magnet is fixed to the bottom wall of the second bearing part through a layer of a bonding material.

10. The gas bearing of claim 9, wherein the permanent magnet is fixed to the bottom wall of the second bearing through spaced layers of bonding material.

11. A lithographic apparatus arranged to transfer a pattern from a patterning device onto a substrate, the apparatus having a gas bearing, the gas bearing comprising:

a first bearing part defining a first bearing surface;

a second bearing part defining a second bearing surface, the first and second bearing parts being arranged so as to define a gap between the first bearing surface and the second bearing surface; and a gas supply device configured to supply a gas to the gap, wherein the first bearing part comprises a ferromagnetic material, and the second bearing part comprises a permanent magnet configured to interact with the ferromagnetic material of the first bearing part, the second bearing surface being between the permanent magnet and the first bearing surface, wherein a portion of the permanent magnet is exposed to an atmosphere adjacent to the second bearing part.

12. A lithographic apparatus comprising:

an illumination system configured to condition a radiation beam;

a patterning support constructed to support a patterning device, the patterning device being capable of imparting the radiation beam with a pattern in its cross-section to form a patterned radiation beam;

a substrate support constructed to support a substrate; and a projection system configured to project the patterned radiation beam onto a target portion of the substrate, wherein the patterning support, the substrate support, or both, comprises a gas bearing, the gas bearing comprising:

a first bearing part defining a first bearing surface;

a second bearing part defining a second bearing surface, the first and second bearing parts being arranged so as to define a gap between the first bearing surface and the second bearing surface; and a gas supply device configured to supply a gas to the gap, wherein the first bearing part comprises a ferromagnetic material, and the second bearing part comprises a permanent magnet configured to interact with the ferromagnetic material of the first bearing part, the second bearing surface being between the permanent magnet and the first bearing surface, wherein a portion of the permanent magnet is exposed to an atmosphere adjacent to the second bearing part.

13. A gas bearing, comprising:

a first bearing part defining a first bearing surface, the first bearing part including a ferromagnetic material;

a second bearing part defining a second bearing surface, the second bearing part including a frame that is adapted to receive a permanent magnet; and a gas supply device configured to supply gas to a gap defined by the first bearing surface and the second bearing surface, and between the first bearing surface and the second bearing surface, wherein the permanent magnet of the second bearing part is configured to interact with the ferromagnetic material of the first bearing part through a portion of the frame to reduce the gap, the second bearing surface being between the permanent magnet and the first bearing surface, wherein a portion of the permanent magnet is exposed to an atmosphere adjacent to the second bearing part.

14. A method of moving a first part relative to a second part, the first part defining a first bearing surface and including a ferromagnetic material, and the second part defining a second bearing surface and including at least one permanent magnet exposed to an atmosphere adjacent to the second part, and fastened to a frame that is adapted to receive at least one permanent magnet, the second bearing surface being between the permanent magnet and the first bearing surface, the method comprising:

supplying gas between the first bearing surface and the second bearing surface so as to create a gap between the first bearing surface and the second bearing surface; and creating a magnetic interaction between the at least one permanent magnet exposed to the atmosphere adjacent to the second part and the ferromagnetic material of the first part through a portion of the second bearing surface of the frame so as to reduce the gap.

* * * * *